United States Patent
Benni et al.

(10) Patent No.: US 9,411,370 B2
(45) Date of Patent: Aug. 9, 2016

(54) HUMAN-MACHINE DIALOG SYSTEM

(71) Applicant: Schneider Electric Industries SAS, Rueil Malmaison (FR)

(72) Inventors: Dominique Benni, Mornac (FR); Francis Chauvet, Mouthiers (FR); Alain Guillot, Fleac (FR)

(73) Assignee: SCHNEIDER ELECTRIC INDUSTRIES SAS, Rueil Malmaison (FR)

( * ) Notice: Subject to any disclaimer, the term of this patent is extended or adjusted under 35 U.S.C. 154(b) by 394 days.

(21) Appl. No.: 14/160,832

(22) Filed: Jan. 22, 2014

(65) Prior Publication Data

US 2014/0289438 A1 Sep. 25, 2014

(30) Foreign Application Priority Data

Mar. 22, 2013 (FR) ...................................... 13 52582

(51) Int. Cl.
| | |
|---|---|
| *G06F 3/00* | (2006.01) |
| *G06F 1/16* | (2006.01) |
| *G06F 3/02* | (2006.01) |
| *H03K 17/972* | (2006.01) |
| *G06F 13/40* | (2006.01) |

(52) U.S. Cl.
CPC ............ *G06F 1/1632* (2013.01); *G06F 3/0202* (2013.01); *G06F 13/4068* (2013.01); *H03K 17/972* (2013.01); *H01H 2229/022* (2013.01); *H01H 2300/032* (2013.01); *Y02B 90/224* (2013.01); *Y04S 20/14* (2013.01)

(58) Field of Classification Search
None
See application file for complete search history.

(56) References Cited

U.S. PATENT DOCUMENTS

| | | | | |
|---|---|---|---|---|
| 3,562,468 A | * | 2/1971 | Stefani | H02G 3/12 174/53 |
| 5,036,168 A | * | 7/1991 | Kikuchi | H01H 23/025 174/53 |
| 5,943,507 A | * | 8/1999 | Cornish | G06F 13/24 710/260 |
| 6,140,593 A | * | 10/2000 | Bramesfeld | H10H 13/70 200/341 |

(Continued)

FOREIGN PATENT DOCUMENTS

| | | |
|---|---|---|
| DE | 198 39 811 A1 | 3/2000 |
| DE | 103 04 595 B3 | 10/2004 |

(Continued)

OTHER PUBLICATIONS

French Preliminary Search Report issued Sep. 25, 2013, in French Application No. 13 52582 filed Mar. 22, 2013 (with Written Opinion and English Translation of Categories of Cited Documents.

*Primary Examiner* — Elias Mamo
(74) *Attorney, Agent, or Firm* — Oblon, McClelland, Maier & Neustadt, L.L.P.

(57) ABSTRACT

The invention concerns a human-machine dialog system (1) comprising:
a support (3) having a plurality of identical docking stations (30), each docking station (30) being associated with a universal human-machine dialog device (4), each universal human-machine dialog device (4) comprising at least a display member (41) and a sensor member (40), a plurality of modular members (2), each modular member (2) being arranged to be positioned in a docking station (30) in a removable and interchangeable manner and comprising a human-machine dialog interface (20) arranged to cooperate with said display member (41) and/or said sensor member (40).

16 Claims, 3 Drawing Sheets

(56) References Cited

U.S. PATENT DOCUMENTS

| | | | |
|---|---|---|---|
| 6,226,174 B1 * | 5/2001 | Pratt | H01R 9/2408 174/58 |
| 7,760,100 B2 * | 7/2010 | August | H01H 9/0271 340/10.1 |
| 2002/0117386 A1 | 8/2002 | Clegg et al. | |
| 2004/0074742 A1 | 4/2004 | Clegg et al. | |
| 2004/0163936 A1 | 8/2004 | Clegg et al. | |
| 2005/0269196 A1 | 12/2005 | Brown et al. | |
| 2006/0028236 A1 | 2/2006 | Brown et al. | |
| 2007/0209912 A1 | 9/2007 | Clegg et al. | |
| 2007/0209913 A1 | 9/2007 | Clegg et al. | |
| 2007/0209916 A1 | 9/2007 | Clegg et al. | |
| 2009/0184839 A1 * | 7/2009 | Brown | H01H 13/70 340/4.31 |
| 2009/0195405 A1 | 8/2009 | Brown et al. | |
| 2009/0195406 A1 | 8/2009 | Brown et al. | |
| 2011/0181446 A1 * | 7/2011 | O'Donnell | H01H 13/76 341/22 |
| 2012/0191458 A1 | 7/2012 | Benni et al. | |

FOREIGN PATENT DOCUMENTS

| | | |
|---|---|---|
| EP | 2 479 646 A1 | 7/2012 |
| WO | WO 2007/048054 A2 | 4/2007 |

* cited by examiner

HUMAN-MACHINE DIALOG SYSTEM

TECHNICAL FIELD OF THE INVENTION

The present invention relates to a human-machine dialog system. The invention more particularly relates to a modular human-machine dialog system, the architecture of which can adapt easily to the controlled application.

PRIOR ART

A human-machine dialog system comprising several human-machine dialog members arranged in a support, in a removable and interchangeable manner, is known from patent application EP2479646. The human-machine dialog members are connected to a central unit by way of a communication and power supply bus. According to its function, the human-machine dialog member has for example a push-button or a display member. The human-machine dialog member also has processing means making it possible to permanently monitor the state of the push-button or to control the ignition or the extinction of the display member. A central memory or several memories arranged in each member make it possible to memorize the state of each human-machine dialog member.

The architecture described in application EP2479646 offers a high level of modularity in that the human-machine dialog members are easily replaceable, without any particular configuration. However, this architecture exhibits some drawbacks, including:
- The need to use an electronics card in each human-machine dialog member,
- The need to power the electronics card situated in the human-machine dialog member,
- The need to endow the human-machine dialog members with electrical contacts for connecting to the communication and power bus.

Other human-machine dialog systems are known from documents US2004/163936, DE19839811 and US2005/269196.

The aim of the invention is therefore to provide a human-machine dialog system making it possible to alleviate the drawbacks listed above, said system being of moderate cost and with improved sealing.

SUMMARY OF THE INVENTION

This aim is achieved by a human-machine dialog system comprising:
- a support having a plurality of identical docking stations, each docking station being associated with a universal human-machine dialog device, each universal human-machine dialog device comprising at least a display member and a sensor member,
- a plurality of modular members, each modular member being arranged to be positioned in a docking station in a removable and interchangeable manner and comprising a human-machine dialog interface arranged to cooperate with said display member and/or said sensor member, said plurality of modular members including a first modular member positioned in a first docking station and whose human-machine dialog interface is a control interface and a second modular member positioned in a second docking station and whose human-machine dialog interface is a display interface,
- a central control unit arranged to receive a control signal from the sensor member of the first docking station when the control interface of the first modular member is activated and to send a control order to the display member of the second docking station to activate the display interface of the second modular member.

Advantageously, the control interface has an activation button.

In a first variant embodiment, the sensor member has a switch with magnetic action. The activation button then bears at least one permanent magnet that can be activated by movement to act on the switch with magnetic action.

In a second variant embodiment, the sensor member has a switch with mechanical action. The activation button then has an activation element arranged to cooperate with the switch with mechanical action.

In another variant embodiment, the sensor member has a capacitive, inductive, optical or resistive effect.

Advantageously, the support has means for fastening it to a wall and these fastening means have two orifices, each intended to receive a fastening screw.

Advantageously, the system has a central control unit and a cable linking said central control unit to the universal human-machine dialog devices, said central control unit being arranged to supply power to each universal human-machine dialog device and exchange signals with each universal human-machine dialog device.

In a first variant embodiment, the universal human-machine dialog devices are connected to the central unit by a multipoint link using a communication and power supply bus.

In another variant embodiment, the universal human-machine dialog devices are connected to the central unit by a point-to-point link.

According to another feature, each modular member has an electronic tag storing in its memory the type of human-machine dialog interface of the modular member with which it is associated. The system can then have a station for reading the electronic tags that are incorporated into each modular member, said reading station having an antenna arranged inside the support.

In a variant embodiment, the system can have a wireless communication module arranged to exchange data with the central control unit via a wireless link.

Advantageously, the docking stations are arranged in a contiguous manner on the support.

In a first variant embodiment, the modular members are joined to the support using a cover attached to the support.

In another variant embodiment, the modular members are joined to the support using clipping means.

Advantageously, each modular member has a square-shaped housing in which said human-machine dialog interface is mounted.

BRIEF DESCRIPTION OF THE FIGURES

Other characteristics and advantages will appear in the following detailed description, made with reference to the appended drawings in which.

DETAILED DESCRIPTION OF AT LEAST ONE EMBODIMENT

The invention concerns a human-machine dialog system 1 having a plurality of human-machine dialog members.

In a known manner, a human-machine dialog member, for example of push-button, rotary knob or signal light type, is composed of:
- a functional member performing a switching and/or display function,
- a human-machine dialog interface comprising a control interface on which a user acts to perform the switching function and/or a display interface returning display information produced by the functional display member.

The term "functional member with a switching function" is understood to mean the elements that make it possible to fulfil the function of the human-machine dialog member. This includes any sensor member, for example with magnetic or mechanical action, with capacitive, inductive, optical or resistive effect. The term "functional member with a display function" is understood to mean any display member, such as for example a light-emitting diode or an RGB (Red Green Blue) system. The light-emitting diode can be of white colour, the colour of the human-machine dialog member being produced by the human-machine dialog interlace. The RGB system is controlled in colour and intensity by an electronic control unit.

The term "control interface" is understood to mean, for example, an activation button of push-button type, rotary knob with at least two positions and the term "display interface" is understood to mean, for example, a coloured cap or a coloured transparent plate.

Of course, certain human-machine dialog members have both a control interface and a display interface. This is for example the case of luminous push-buttons.

The invention consists in dissociating the functional member from its human-machine dialog interface by proposing a solution enabling a user to configure his or her system by choosing the human-machine dialog interface that he or she wishes to use without having to touch the functional member. By using a universal human-machine dialog device performing all the functions of the functional member (mainly switching and display functions), the user can thus adapt to it a human-machine dialog interface comprising a control interface and/or a display interface. The system of the invention is explained in detail below.

Figure 1:
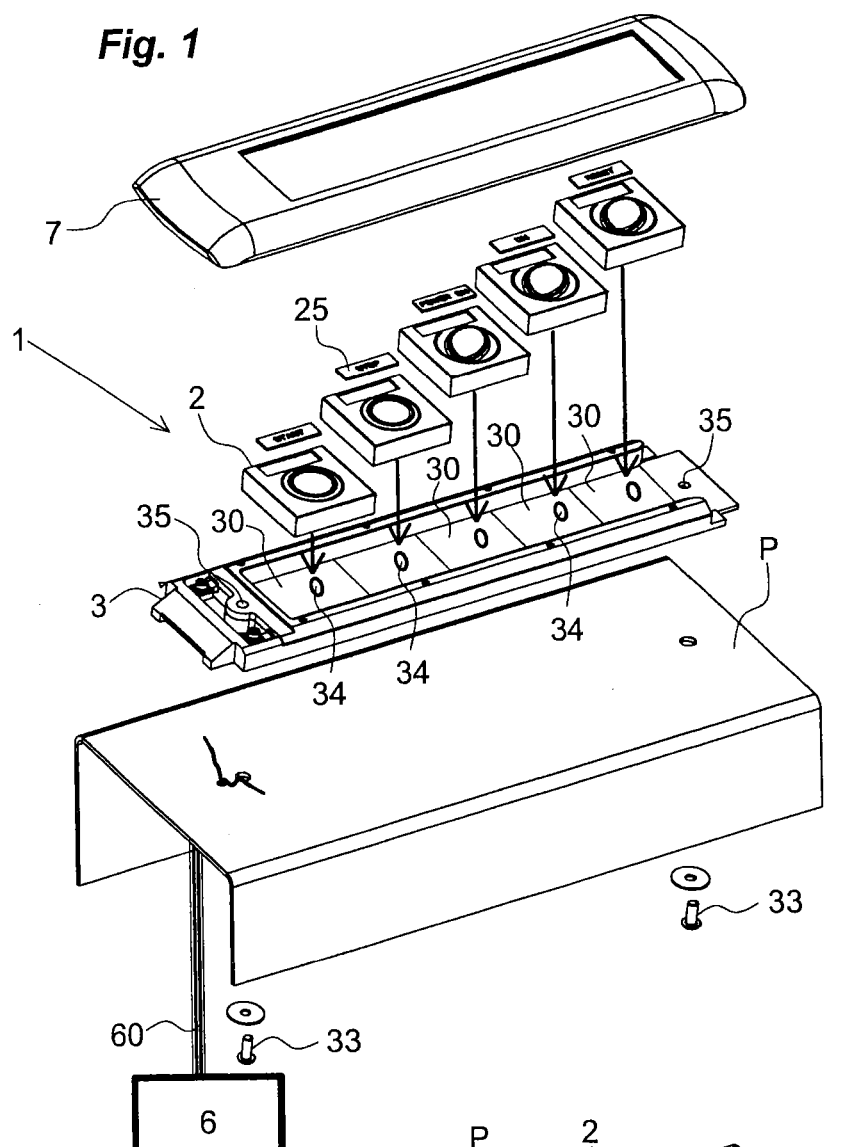
FIG. 1 represents, in an exploded view, the human-machine dialog system of the invention.
Figure 2:
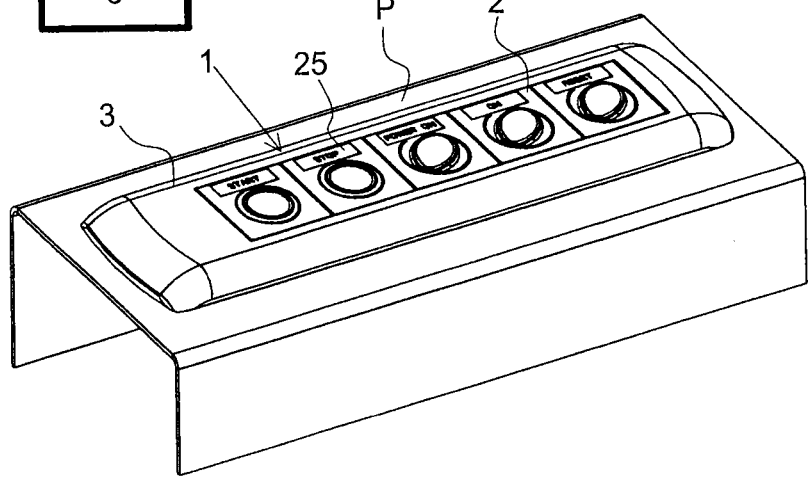
FIG. 2 represents, in a perspective view and mounted on a wall, the human-machine dialog system of the invention.

According to the invention, with reference to FIG. 1, the human-machine dialog system 1 has a support 3, made for example of plastic and comprising a lower face and an upper face. The support 3 is for example intended to be fastened by its lower face to a wall P, for example the wall of an electrical enclosure or a control console. The support 3 has for example fastening means for fastening to said wall P. Said fastening means include for example two orifices 35, each intended to receive one end of a screw 33 passing through said wall P.

According to the invention, the support 3 has several docking stations 30, preferably identical (artificially delimited by lines in FIG. 1), arranged in a docking slot or surface of the support. The docking stations 30 are each associated with an identical universal human-machine dialog device 4 (visible in FIGS. 4A and 4B). The universal human-machine dialog device 4 is capable of performing the switching function and the display function described above. More precisely, each universal human-machine dialog device 4 therefore has at least one sensor member 40 in charge of performing the switching function and a display member 41 in charge of performing the display function. At each docking station 30, all the functions are therefore performed in such a way as to allow a user to be able add to the human-machine dialog interface of his or her choice to it.

Figure 4A:
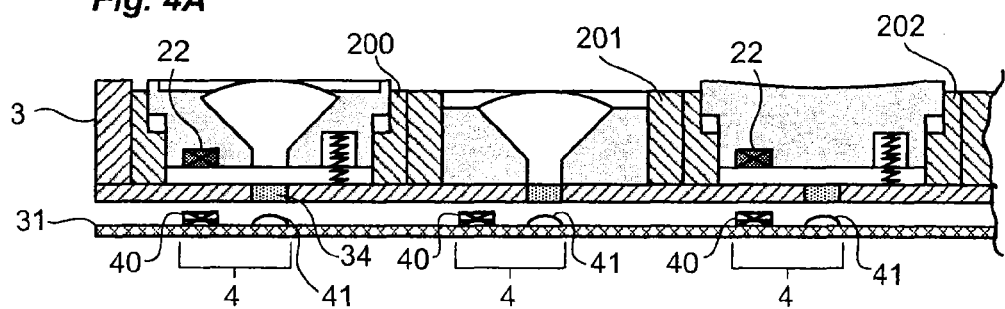
FIGS. 4A and 4B represent, in a partial longitudinal sectional view, the human-machine dialog system of the invention, in two separate embodiments.
Figure 4B:
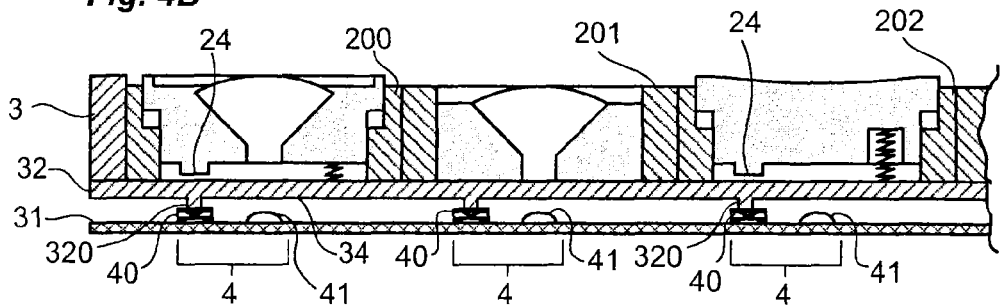

According to the invention, the docking stations 30 are formed in the support 3 and consist in several housings of identical shapes. In the appended figures, the housings are produced in a contiguous manner in such a way as to form the docking slot or surface described above. The support 3 incorporates one or more electronics cards supporting the universal human-machine dialog devices 4. In FIGS. 4A and 4B, a single electronics card 31 is used and the latter extends inside the support 3, underneath the docking stations 30. The universal human-machine dialog devices 4 are soldered onto the electronics card 31, facing each docking station 30. At the level of each docking station 30, the support 3 thus has an opening made facing the display member 41 of the universal human-machine display device 4, each opening being for example closed by a translucent or transparent window 34 in such a way as to guarantee the tightness of the inside space of the support including the electronics card 30 with respect to the outside. Using the technology used for producing the sensor member 40, the support 3 will have an adapted architecture.

According to the invention, the human-machine dialog system 1 also comprises a plurality of modular members 2 each comprising only one human-machine dialog interface as described above. A modular member 2 contains neither electronics card, nor functional switching or display member. It is independent with respect to its functional member.

Figure 5:
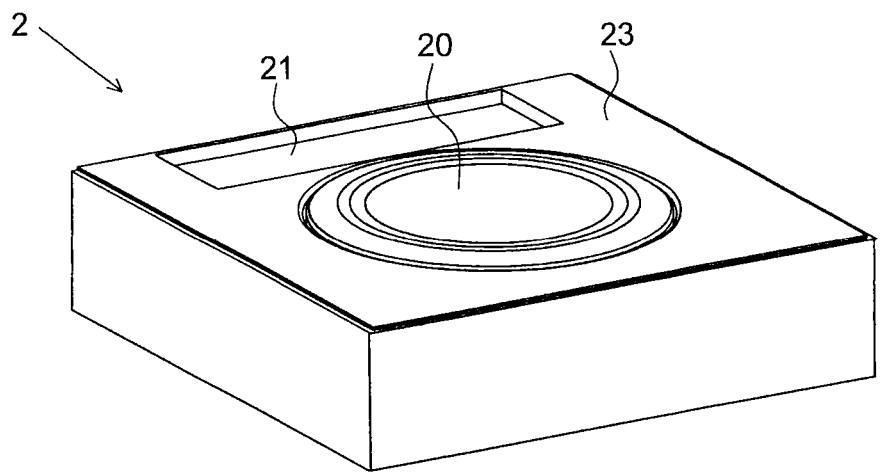
FIG. 5 represents a modular member used in the human-machine dialog system of the invention.

According to the invention, each modular member 2 occupies a docking station 30 of the support 3. With reference to FIG. 5, a modular member 2 has a housing 23, for example made of plastic, arranged to be housed in and fit the shape of a housing of the support 3. It also comprises a human-machine dialog interface 20 (for example a push-button in FIG. 5) and can have a place 21 for positioning a tag 25 bearing the member's name. According to the invention, the human-machine dialog interface is intended to cooperate with a universal human-machine dialog device 4 as described above. According to the type of modular member 2 positioned on a docking station 30 of the support, the human-machine dialog interface 20 cooperates with the sensor member 40 and/or with the display member 41.

Figure 3:
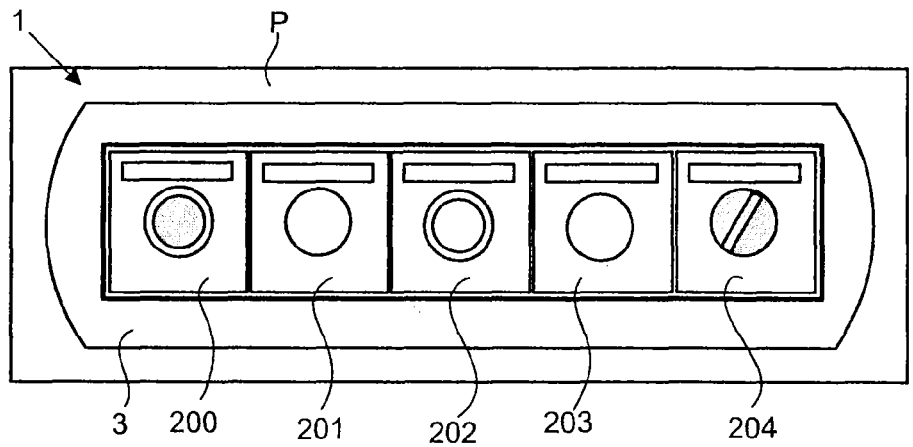
FIG. 3 represents, in a top view, the human-machine dialog system of the invention.

FIG. 3 shows an example of an architecture of a human-machine dialog system of the invention. This system has, at a first docking station 30, a first modular member 200 comprising a control interface of push-button type and a display interface, at a second docking station, a second modular member 201 with only a display interface, at a third docking station, a third modular member 202 with only a control interface of push-button type, at a fourth docking station, a fourth modular member 203 with another display interface and at a fifth docking station, a fifth modular member 204 with a control interface of rotary knob type.

FIGS. 4A and 4B are a partial representation and a sectional view of the human-machine dialog system illustrated in FIG. 3 (only three modular members are represented). In FIG. 4A, the display interface of the first modular member 200 is placed facing the display member 41 of the universal human-machine dialog device of the first docking station and the control interface cooperates with the sensor member 40 of the human-machine dialog device associated with the first docking station. The display interface of the second modular member 201 is placed facing the display member 41 of the universal human-machine dialog device associated with the second docking station. The sensor member 40 of this universal human-machine dialog device is not used for the second modular member 201. The control interface of the third modular member 202 cooperates with the sensor member 40 of the universal human-machine dialog device associated with the third docking station. The display member 41 of the universal device is not used for the third modular member 202.

According to the invention, the control interface of the first modular member 200 and of the third modular member 202 includes for example a permanent magnet 22 (FIG. 4A) that can be activated by movement to act on the sensor member 40. The sensor member 40 thus includes a Hall-effect sensor or a magnetic action micro-switch of MEMS or reed type. The sensor member 40 can have monostable or bistable action. No mechanical link being present between the modular member 2 and the universal human-machine dialog device 4, control by magnetic effect offers advantages in terms of sealing and resistance to wear.

In a variant embodiment, the sensor member 40 can also have a switch with mechanical action. With reference to FIG. 4B, the support thus has a flexible membrane 32, forming on the support, the docking surface of the modular members, said flexible membrane 32 being positioned just above the electronics card 31 bearing the sensor member 40. Facing each sensor member 40, the flexible membrane 32 has a push-button 320 arranged underneath said flexible membrane 32, on the lower face of the latter, in such a way as to be able to cooperate mechanically with the sensor member 40. The control interface of a modular member (for example modular members 200 and 202 in FIG. 4B) contains for example an activation element 24 arranged to cooperate with the flexible membrane 32, on the upper face of the latter. When acting on the control interface, the activation element 24 pushes the flexible membrane 32. Thanks to its flexibility, the flexible membrane 32 moves its push-button 320 in translation, the push-button coming to rest on the sensor member situated below. Of course, other mechanical arrangements could be considered. Of course, it must be understood that the architecture shown in FIG. 3 and FIGS. 4A and 4B is only an example. The control interface could be of any other type and use a rotary knob or other solution suitable for cooperating with the sensor member 40. Similarly, the sensor member 40 could be of another type, and use other detection solutions with resistive, optical, capacitive effects etc. The modular member in charge of cooperating with such sensor members will then have an architecture suitable for operating this sensor member 40.

According to the invention, the modular members 2 are positioned in the support 3 in a removable and interchangeable manner. The modular members 2 can be easily swapped in the system or can each be replaced easily in the event of a breakdown or in the event of its control evolving. According to the invention, the housing 23 of the modular members is preferably square-shaped, which allows them to be able to take two separate orientations, shifted with respect to each other by 90°. The support will thus be fastened in one and the same plane in two orientations, shifted with respect to each other by 90°.

Several architectures can be envisaged for maintaining the modular members in the system.

A first architecture consists in positioning the modular members 2 in the support 3 then in maintaining them by a cover 7 which is positioned on the support (FIG. 1).

A second architecture (not represented) consists for example in positioning a cover on the support then in equipping the support and the modular members with rapid fastening means in the cover or the support, for example clipping means. Of course, other fastening configurations could be envisaged.

According to the invention, the universal human-machine dialog devices 4 incorporated into the support are attached to a central control unit 6 (FIG. 1) by a point-to-point link or by a multipoint link. The central control unit 6 provides the power supply and data transfer to each universal human-machine dialog device 4. The central control unit will be able to be incorporated into the system or produced in a separate device. The central unit can then send a control order, individually, to each display member 41 of a universal human-machine dialog device 4 and receive a control signal from each sensor member 40 of the universal human-machine dialog devices 4 that are connected to it.

In a point-to-point link, each universal device 4 is therefore connected in an independent manner to the central control unit 6. The support 3 therefore incorporates a sheet of wires connected to the central control unit 6. In this configuration, a configuration of the central control unit is necessary to inform it of the type of modular member placed facing the docking stations 30.

In a multipoint link, the universal human-machine dialog devices 4 are connected to the central control unit 6 by way of a communication and power supply bus arranged inside the support 3, for example on the electronics card 31 supporting the universal human-machine dialog devices 4. A communications protocol is therefore necessary to provide communication between the central control unit 6 and the universal human-machine dialog devices 4. In multipoint, each control signal sent by the central control unit 6 or received by the latter must include the identifier of the destination or sender universal human-machine dialog device 4. The communications protocol is for example a two-wire protocol making it possible to pass both the power supply of the universal human-machine dialog devices 4 and the communication frames exchanged between each universal human-machine dialog device 4 and the central control unit 6. A protocol of this type that is already known is "OneWire" (also called DALLAS protocol) described at the following address:

http://daniel.menesplier.free.fr/Doc/BUS%201%20WIRE.pdf

In an architecture with a communication bus, a training step will be necessary in order to inform the central control unit 6 of the type of modular member 2 present at each docking station 30, in such a way that the central control unit 6 provides control adapted to the universal human-machine dialog devices 4.

According to the invention, the central control unit 6 can be incorporated into the support 3, partly or totally remote from said support. In FIG. 1, the central control unit 6 is shown remote from the support 3 and linked to the universal human-machine dialog devices 4 by way of a cable 60 providing the power supply and data transfer. In FIG. 1, the cable 60 passes through the wall P and connects to terminals provided inside the support 3 and intended to be masked by the cover 7.

Advantageously, the human-machine dialog system will be adapted for implementing the emergency stop function. To do this, the support 3 will incorporate a sensor member suitable for performing this function, this sensor member being linked to the central control unit 6 by a secure link. It will be possible to associate the sensor member with a predetermined docking station 30, intended to receive a specific member having a control interface of emergency stop type. In a variant embodiment, it will be possible to incorporate this specific member into the support 3, associated with its sensor member.

In a variant embodiment, each modular member 2 can incorporate an electronic tag storing in its memory an identifier and the function of the modular member. This can be an RFID tag, for example. A reading station (for example incorporated into the central control unit 6) comprising an antenna incorporated into the support 3 thus makes it possible to detect the occupied docking stations 30 and to determine the function of each modular member 2 occupying a docking station. This architecture thus makes it possible to dispense with the training step.

In a variant embodiment, the system can include a wireless communication module making it possible to exchange signals with the central control unit 6 across a wireless link. The communication can be achieved for example by radio waves via known protocols of WIFI, Bluetooth type etc. The data exchanged notably include the control orders transmitted by each sensor member and/or the ignition or extinction orders transmitted by the central control unit 6 to the display members. This communication module can include a centralized transmitter/receiver, incorporated into the support 3 and in charge of exchanging data with the central control unit 6. It can also include several separate transmitter/receivers, each associated with a universal human-machine dialog device 4.

The invention therefore consists in separating the switching and display functions, performed by the sensor member and by the display member, of the control and/or display interface. By proposing to use universal human-machine dialog devices with both functions on-board, it is thus possible to dispense with the limitations on the positioning of the modular members, to choose its configuration easily and to modify it.

The human-machine dialog system 1 of the invention therefore has the following advantages:
- it enables an operator to choose or to adapt his or her configuration, as a function of the controlled application,
- it enables one modular member to be easily replaced by another,
- it is easy to install, in that it requires only two fastening holes for the support and a hole for running the cable,
- it enables modular members to be offered at a moderate cost, the latter not having any on-board electronics card,
- the electronics card being housed inside the support, it is easy to ensure its insulation from the outside and to guarantee a good level of sealing,
- it has a small bulk,
- it can be fastened in two separate orientations, shifted with respect to each other by 90°.

The invention claimed is:

1. A human-machine dialog system, comprising:
a support having a plurality of identical docking stations, each docking station being associated with a universal human-machine dialog device, each universal human-machine dialog device comprising at least a display member and a sensor member,
a plurality of modular members, each modular member being arranged to be positioned in a docking station in a removable and interchangeable manner and comprising a human-machine dialog interface arranged to cooperate with said display member and/or said sensor member, said plurality of modular members including a first modular member positioned in a first docking station and whose human-machine dialog interface is a control interface and a second modular member positioned in a second docking station and whose human-machine dialog interface is a display interface,
a central control unit arranged to receive a control signal from the sensor member of the first docking station when the control interface of the first modular member is activated and to send a control order to the display member of the second docking station to activate the display interface of the second modular member,
wherein
each modular member has an electronic tag storing in its memory the type of human-machine dialog interface of the modular member with which it is associated, and
the system has a station for reading the electronic tags that are incorporated into each modular member, said reading station having an antenna arranged inside the support.

2. The system according to claim 1, wherein the control interface has an activation button.

3. The system according to claim 2, wherein the sensor member has a switch with magnetic action.

4. The system according to claim 3, wherein the activation button bears at least one permanent magnet that can be activated by movement to act on the switch with magnetic action.

5. The system according to claim 2, wherein the sensor member has a switch with mechanical action.

6. The system according to claim 5, wherein the activation button has an activation element arranged to cooperate with the switch with mechanical action.

7. The system according to claim 1, wherein the sensor member has a capacitive, inductive, optical or resistive effect.

8. The system according to claim 1, wherein the support has means for fastening it to a wall and in that these fastening means have two orifices, each intended to receive a fastening screw.

9. The system according to claim 1, wherein it has a central control unit and a cable linking said central control unit to the universal human-machine dialog devices, said central control unit being arranged to supply power to each universal human-machine dialog device and exchange signals with each universal human-machine dialog device.

10. The system according to claim 9, wherein the universal human-machine dialog devices are connected to the central unit by a multipoint link using a communication and power supply bus.

11. The system according to claim 9, wherein the universal human-machine dialog devices are connected to the central unit by a point-to-point link.

12. The system according to claim 9, wherein it has a wireless communication module arranged to exchange data with the central control unit via a wireless link.

13. The system according to claim 1, wherein the docking stations are arranged in a contiguous manner on the support.

14. The system according to claim 1, wherein the modular members are joined to the support using a cover attached to the support.

15. The system according to claim 1, wherein the modular members are joined to the support using clipping means.

16. The system according to claim 1, wherein each modular member has a square-shaped housing in which said human-machine dialog interface is mounted.

* * * * *